US012063052B2

(12) United States Patent
Strachan et al.

(10) Patent No.: US 12,063,052 B2
(45) Date of Patent: *Aug. 13, 2024

(54) ANALOG ERROR DETECTION AND CORRECTION IN ANALOG IN-MEMORY CROSSBARS

(71) Applicant: Hewlett Packard Enterprise Development LP, Spring, TX (US)

(72) Inventors: John Paul Strachan, San Carlos, CA (US); Catherine Graves, Milpitas, CA (US); Can Li, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/482,964

(22) Filed: Oct. 9, 2023

(65) Prior Publication Data
US 2024/0039562 A1    Feb. 1, 2024

Related U.S. Application Data

(63) Continuation of application No. 17/580,146, filed on Jan. 20, 2022, now Pat. No. 11,804,859.

(51) Int. Cl.
| | | |
|---|---|---|
| *H03M 13/00* | (2006.01) | |
| *G11C 13/00* | (2006.01) | |
| *H03M 13/15* | (2006.01) | |
| *G11C 27/00* | (2006.01) | |
| *H03M 13/11* | (2006.01) | |

(52) U.S. Cl.
CPC ....... *H03M 13/6597* (2013.01); *G11C 13/004* (2013.01); *H03M 13/1575* (2013.01); *G11C 13/0069* (2013.01); *G11C 27/005* (2013.01); *H03M 13/1177* (2013.01)

(58) Field of Classification Search
CPC .......... H03M 13/6597; H03M 13/1575; G11C 13/004
See application file for complete search history.

(56) References Cited

U.S. PATENT DOCUMENTS

| | | | | |
|---|---|---|---|---|
| 10,452,472 B1 * | 10/2019 | Graves | ............... | G06F 11/1048 |
| 11,244,723 B1 * | 2/2022 | Karunaratne | ....... | G06F 15/7867 |

(Continued)

*Primary Examiner* — Joseph D Torres
(74) *Attorney, Agent, or Firm* — Dickinson Wright

(57) ABSTRACT

An analog error correction circuit is disclosed that implements an analog error correction code. The analog circuit includes a crossbar array of memristors or other non-volatile tunable resistive memory devices. The crossbar array includes a first crossbar array portion programmed with values of a target computation matrix and a second crossbar array portion programmed with values of an encoder matrix for correcting computation errors in the matrix multiplication of an input vector with the computation matrix. The first and second crossbar array portions share the same row lines and are connected to a third crossbar array portion that is programmed with values of a decoder matrix, thereby enabling single-cycle error detection. A computation error is detected based on output of the decoder matrix circuitry and a location of the error is determined via an inverse matrix multiplication operation whereby the decoder matrix output is fed back to the decoder matrix.

20 Claims, 4 Drawing Sheets

(56) References Cited

U.S. PATENT DOCUMENTS

| | | | |
|---|---|---|---|
| 2013/0248814 A1* | 9/2013 | Hou | H10B 63/80 |
| | | | 257/5 |
| 2019/0034268 A1* | 1/2019 | Roth | G06F 11/1068 |
| 2020/0081766 A1* | 3/2020 | Giancristofaro | H04L 1/0071 |
| 2020/0133997 A1 | 4/2020 | Roth et al. | |
| 2020/0382135 A1* | 12/2020 | Roth | G06F 17/16 |

* cited by examiner

ANALOG ERROR DETECTION AND CORRECTION IN ANALOG IN-MEMORY CROSSBARS

CROSS-REFERENCE TO RELATED APPLICATIONS

This application claims priority to U.S. Provisional Patent Application No. 17/580,146, filed Jan. 20, 2022, the contents of which is incorporated herein by reference in its entirety.

BACKGROUND

Vector-matrix computations are performed in many applications including data compression, neural networks, encryption, and so forth. Hardware techniques for optimizing vector-matrix computations include the use of application-specific integrated circuits (ASICs), field-programmable gate arrays (FPGAs), graphics processing units (GPUs), and more recently, an analog dot product computing device based on a crossbar array.

BRIEF DESCRIPTION OF THE DRAWINGS

The present disclosure, in accordance with one or more various aspects, is described in detail with reference to the following figures. The figures are provided for purposes of illustration only and merely depict typical or example aspects of the disclosed technology.

Figure 1:
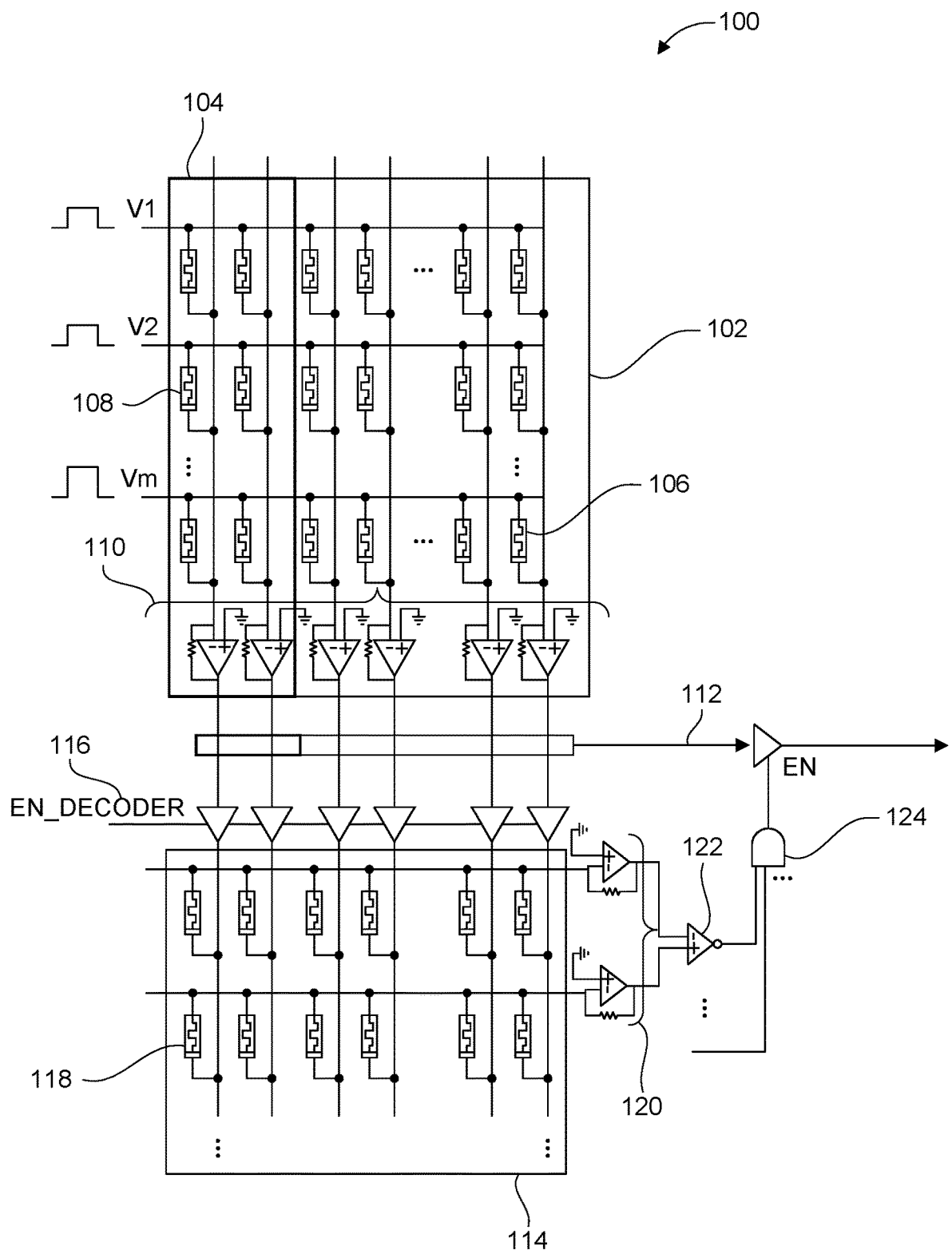
FIG. 1 depicts a circuit implementation for analog error detection and correction, according to aspects of the disclosed technology.

The figures are not exhaustive and do not limit the present disclosure to the precise form disclosed.

DETAILED DESCRIPTION

Analog computing devices based on crossbar arrays have proven to be efficient for a number of applications. A crossbar array, as that term is used herein, refers to an array that includes a set of row lines and a set of column lines that intersect the row lines to form a junction at each point of intersection, and where a respective memory device is coupled to each junction and programmed with a matrix value. The memory devices coupled to the junctions may be memristors or may be devices that utilize other non-volatile resistive memory technology such as flash memory, spin transfer torque (STT) or magnetic tunnel junction (MTJ) magnetic random access memory (MRAM), phase-change memory, or the like. An input value along each row line of the crossbar array is weighted by the matrix values in each column and accumulated as an output from each column to form a dot product. As such, an analog memory crossbar array may also be referred to as a dot product engine (DPE).

While crossbar arrays are efficient for analog computing, inaccuracies while programming the memory devices in the crossbar array and noise while reading the output can affect the accuracy of the computations. Moreover, inaccuracies may also arise at the junctions in the crossbar array if they become shorted, non-programmable, or stuck in an open state. Thus, while memristor, or other non-volatile resistive analog memory, crossbar-based matrix multiplication accelerators have shown great promise, their tendency to generate unexpected computing errors can limit their opportunities to replace mainstream digital systems. In particular, while various analog computing applications are tolerant of small errors (e.g., neural networks), significant outliers can pose a problem unless detected and corrected.

A technique for detecting/correcting errors in analog computations has been described in commonly-owned co-pending U.S. application Ser. No. 16/429,983. This technique provides an error correcting code (ECC) for analog computing that enables the detection and correction of computation errors while using DPEs for vector-matrix multiplication. Aspects of the present technology disclosed herein relate to a circuit implementation for the analog ECC described in the above-referenced co-pending application. According to aspects of the disclosed technology, a first crossbar array portion is programmed with target computation matrix values, a second crossbar array portion is programmed with encoder matrix values for correcting computation errors in a matrix multiplication result output of the first crossbar array portion, and a third crossbar array portion is programmed with decoder matrix values for detecting the computation errors.

In some aspects, the circuit disclosed herein connects the first crossbar array portion encoding the target computation matrix and the second crossbar array portion encoding the encoder matrix to the third crossbar array portion encoding the decoder matrix, thereby enabling single-cycle analog error detection. The first, second, and third crossbar array portions may form part of one or more crossbar arrays. For example, a first crossbar array of memristors may include the first and second crossbar array portions and a second crossbar array that is connected to the first crossbar array may include the third crossbar array portion. Alternatively, the circuit may include a single crossbar array that includes the first, second, and third crossbar array portions.

Aspects of the disclosed technology also relate to an analog error correction circuit implementation that enables a reverse DPE operation, e.g., an inverse matrix multiplication involving the third crossbar array portion that encodes the decoder matrix. The reverse DPE operation enables determining a location of a computation error in a matrix multiplication output. More specifically, the third crossbar array portion may receive, as input, a matrix multiplication output from the first and second crossbar array portions, and may itself output a syndrome vector that indicates whether computation errors are present in the matrix multiplication output.

As described in more detail later in this disclosure, in some aspects, each column in the decoder matrix may include two non-zero values, and as such, a computation error may be detected if the syndrome vector includes two outside-threshold values, where an outside-threshold value is a value above a first threshold value or below a second threshold value (the second threshold value may be a negative of the first threshold value). Further, in some aspects, the measured syndrome vector may be thresholded (i.e., converted to binary values) and fed back to the third crossbar array portion to perform the inverse matrix multiplication with the decoder matrix encoded in the third crossbar array portion. In some aspects, a location of a particular expected value in the resulting inverse matrix multiplication output vector may indicate a location of the computation error.

The circuit implementation disclosed herein provides a technical solution to the technical problem of implementing the above-referenced analog ECC. This technical solution offers a number of technical improvements/benefits to analog error detection technology. Among these is the capability to perform single-cycle analog error detection, which improves the efficiency of the analog error detection/correction process, and which is enabled by the circuit connection of the first and second crossbar array portions that encode the encoder matrix and computation matrix, respectively, to the third crossbar array portion that encodes the decoder matrix. In addition, the encoder and decoder matrices can be selectively disabled, re-used, and/or re-routed between crossbar arrays to dynamically control the usage of error detection and to save power and/or reduce latency overhead when error detection is not desired or when error detection is only required for a portion of the data in a computation batch. Still further, an analog error correction implementation according to example aspects of the disclosed technology that involves a reverse DPE operation provides the technical benefit of obviating the need for a separate look-up table for error location calculation, which leads to further chip area and energy savings.

FIG. 1 depicts an example implementation of an analog error detection circuit 100 according to aspects of the disclosed technology. The circuit 100 includes various crossbar array portions that form part of one or more analog crossbar arrays. The circuit 100 includes a first crossbar array portion that includes circuitry 102 programmed with analog values representing values of an actual target computation matrix A' for performing vector-matrix multiplication. The circuit 100 further includes a second crossbar array portion that includes circuitry 104 programmed with the values of an encoder matrix A" used to correct errors in a first output of the first crossbar array portion, where the first output represents a multiplication result of an input vector u with the computation matrix A'.

More specifically, the circuit 100 includes a crossbar array of $\ell$ row lines and n column lines that intersect to form intersection junctions, with a memory device (e.g., a memristor) coupled to each intersection junction and encoding a matrix value. Thus, the crossbar array includes $\ell \times n$ memory locations. The $\ell$ rows of the crossbar array may receive an input signal as a vector of length $\ell$. The n columns may then output an output signal as a vector of length n that is the dot product of the input signal and the matrix values encoded in the $\ell \times n$ memory locations.

In some aspects, an $\ell \times n$ matrix A may be programmed into the crossbar array containing the $\ell$ row lines and n column lines. The matrix A may have the following structure: $A=(A'|A")$, where A' is the target computation matrix (an $\ell \times k$ matrix that includes a first k columns of A) and A" is the encoder matrix (an $\ell \times m$ matrix that includes the remaining m=n−k columns of matrix A). More specifically, a set of k columns of the n columns (where k<n) of the crossbar array (i.e., the k columns constituting the circuitry 102) may be programmed with the values of the target computation matrix A'. Further, a second set of m (e.g., n−k) columns (i.e., the circuitry 104) may be programmed with continuous analog values corresponding to the values of the encoder matrix A". Each row of the encoder matrix A" may be determined from a respective corresponding row of the computation matrix A' so that computation errors above a threshold error value can be detected and corrected in an output vector y representing a matrix multiplication result of the input vector u with the matrix A.

As depicted in FIG. 1, each memory device coupled to a row line and a column line at a respective intersection junction within the circuitry 102 may be a memristor 106 or any other suitable non-volatile resistive memory device. Similarly, each memory device coupled to a row line and a column line at a respective intersection junction within the circuitry 104 may be a memristor 108 or any other suitable non-volatile resistive memory device. Thus, in example aspects, conductance values of the memristors 106 may be tuned to represent the values of the computation matrix A' and conductance values of the memristors 108 may be tuned to represent the values of the encoder matrix A".

In operation, a set of digital-to-analog converters (DACs) (not shown) may be provided to convert an input signal representative of an input vector containing digital values to a set of corresponding voltages, which are then applied to the set of row lines shared between the first crossbar array portion (i.e., circuitry 102) and the second crossbar array portion (i.e., circuitry 104). More specifically, each element $u_i$ of an input vector u is fed into a respective DAC to produce a corresponding voltage level that is proportional to it,. A first output signal from the first crossbar array portion may represent a first output vector c'=uA', which is a result of the desired matrix multiplication computation between the input vector u and the computation matrix A'. More specifically, each element of the first output vector c' may be the dot product of the input vector u with a respective corresponding one of the k columns of the circuitry 102 that encodes the computation matrix A'.

Along similar lines, a second output signal from the second crossbar array portion may represent a second output vector c"=uA", which is a result of a matrix multiplication operation between the input vector u and the encoder matrix A". More specifically, each element of the second output vector c" may be the dot product of the input vector u with a respective corresponding one of the n−k columns of the circuitry 104 that encodes the encoder matrix A". The second output vector c" may include redundancy symbols that allow for correcting computation errors in c'. The first and second output signals can be determined (i.e., the first and second output vectors can be computed) by reading the currents at analog current measuring devices 110, which may be grounded column conductors such as transimpedance amplifiers.

In example aspects, the values of the encoder matrix A" depend on the values of the computation matrix A' but not on the values of the input vector u. Further, in example aspects, the size of the encoder matrix A" having n−k columns depends on the alphabet size q (i.e., the number of levels, or bits of information, programmed into each memristor cell 106 in the first crossbar array portion encoding the computation matrix A'); the desired number of errors τ that the encoder matrix A" is able to correct; and a desired error correction capability (i.e., a threshold error value Δ for delineating a detectable/correctable error).

In general, the actual measured output vector y from the first and second crossbar array portions (i.e., circuitry 102 and circuitry 104) can be represented as y=c+ε+e, where c represents an ideal computational result vector of the matrix multiplication of the input vector u with the matrix values of both the computation matrix A' and the encoder matrix A" (e.g., c may be the concatenation of first output vector c' and second output vector c"); ε is a tolerable analog imprecision; and e is the undesired error. More specifically, −δ<ε<δ, and thus, may be a bounded tolerable imprecision, while e represents detectable and correctable error when e>Δ or e<−Δ and Δ>δ. In particular, e may be a vector whose non-zero entries are outlying errors. In some aspects, an outlying error may be one that is greater than δ or less than −δ. Such an error (i.e., errors greater than δ or less than −δ) may be detectable, but may not be corrected if they do not exceed the threshold error value (i.e., they are within [−Δ, Δ]). An outlying error that exceeds the threshold error value on the other hand (i.e., an error that is greater than Δ or less than −Δ), may be an intolerable error to be corrected. In some aspects, both δ and Δ are pre-set threshold values, with a ration there between being a tunable parameter. In some aspects, the ratio of δ to Δ (or vice versa) may be tuned to narrow the difference between δ to Δ. For instance, in an example aspect, the ratio may be 1, in which case, if an error is detectable, it is then also ensured to be correctable. However, doing so, may result in an increase in the number of redundancy columns the encoder matrix A".

Various types of analog computing errors can occur including transient errors (i.e., errors that do not predictably re-occur), permanent errors, and intrinsic errors. Examples of transient errors include, without limitation, reading noise from the peripheral circuit, memristor conductance fluctuation, and the like. While transient errors can be detected and corrected using the circuit 100 that implements an analog ECC, in some scenarios, as an alternative to correcting the error, the computation can simply be performed again since the error is unlikely to re-occur as it is by definition a transient error. Permanent errors include, without limitation, drift in conductance values, open/short junctions and/or wires, and the like. In example aspects, permanent errors are at least detected, and can be correctable in some scenarios. However, in other scenarios, the DPE block experiencing the permanent error may instead by re-programmed or replaced altogether. Intrinsic errors include, without limitation, inaccurate programming, wire resistance, device I-V non-linearity, and the like. In example aspects, intrinsic errors may be treated as part of the "normal" operation of an analog crossbar-based matrix multiplication accelerator and ignored. In other example aspects, where outlier intrinsic errors are detected, the circuit 100 and the analog ECC that it implements can be employed, when possible, to correct the errors to increase the accuracy of the computation and/or to intentionally tune the result randomness.

Still referring to FIG. 1, the circuit 100 further includes a third crossbar array portion that encodes the values of a decoder matrix. More specifically, circuitry 114 of the third crossbar array portion is programmed with the values of a decoder matrix/parity-checking matrix. Similar to the first and second crossbar array portions, the third crossbar array portion (i.e., circuitry 114) includes intersecting row lines and column lines, where a respective memory device (e.g., memristor 118) is coupled to each intersection junction between a corresponding row line and column line. The first and second crossbar array portions (i.e., circuitry 102 and circuitry 104) may be connected to the third crossbar array portion (i.e., circuitry 114) so as to provide single-cycle analog error detection. That is, the current outputs from the first and second crossbar array portions (which represent output vector c that includes c' (the desired computation result) and c" (the redundancy symbols for correcting an error in the desired computation result)) may be fed directly into the third crossbar array portion (i.e., circuitry 114) without undergoing processing such as an analog-to-digital conversion. In some aspects, the column lines of the circuitry 114 may be the same as the column lines of the circuitry 102 and the circuitry 104. As such, the circuitry 102, the circuitry 104, and the circuitry 114—representing the first, second, and third crossbar array portions, respectively—may constitute a single crossbar array.

In example aspects, the values of the decoder/parity-checking matrix may adhere to various rules specified by the analog ECC depending on a number of errors sought to be detectable and/or correctable. For instance, for detecting a single outlying error, given positive integers r and n, such that r n, then the decoder/parity-checking matrix H is an r×n matrix over $\{0, 1\}$ that satisfies the following properties: 1) each column in H is a unit vector, i.e., each column contains exactly one 1, and 2) the number of 1s in each row is either the closest integer below n/r or the closest integer above n/r. On the other hand, in order to both detect and correct a single outlying error, given positive integers r and n, such that n≤(r−1), then the decoder/parity-checking matrix H is an r×n matrix over $\{-1,0,1\}$ that satisfies the following properties: 1) all columns of H are distinct, 2) each column in H contains exactly two non-zero entries, the first of which is a 1, and 3) the number of non-zero entries in each row of H is the closest integer less than 2n/r or the closest integer greater than 2n/r.

In example aspects, each value in the decoder/parity-checking matrix H that adheres to the above-described properties for correcting a single, outlying error may be encoded by the conductance values of a neighboring pair of memristors 118 in the circuitry 114 (i.e., neighboring memristors 118 in a same column). More specifically, a 1 value in the decoder matrix may be mapped to a neighboring pair of memristors 118 having the tuned conductances (low resistance state (LRS), high resistance state (HRS)), while a −1 value in the decoder matrix may be mapped to (HRS, LRS), and a 0 value may be mapped to (HRS, LRS).

In example aspects, if the computation error in the matrix multiplication result 112 (which represents the result of a matrix multiplication of the input vector u with the computation matrix A') is within a pre-set tolerance value (e.g., the threshold error value Δ), then all output from the circuitry 114 programmed with the decoder matrix values would be below a threshold value, as detected by comparators between neighboring outputs. In example aspects, this is a result of the properties to which the decoder/parity-checking matrix adheres. In particular, as shown in FIG. 1, transimpedance amplifiers 120 may be provided that virtual ground the neighboring row wires in the decoder matrix circuitry 114 and convert the currents to voltages. In particular, the voltage output of each amplifier 120 may be $-I_{in}*R_{ref}$, where $I_{in}$ represents the input current to the amplifier 120 and $R_{ref}$ is a reference voltage. Comparator 122 may then compare these converted voltages to determine if a computation error is within the threshold error value Δ.

More specifically, the threshold error value Δ may be implemented within the comparator 122 as a tunable parameter or an input terminal (not shown), depending on the design. While not shown in FIG. 1 for ease of depiction, it should be appreciated that respective amplifiers 120 and a respective comparator 122 may be provided for each pair of neighboring row outputs from the decoder matrix circuitry 114. That is, a different set of amplifiers 120 may be provided to convert the current outputs from rows 3 and 4 of the decoder matrix circuitry 114 to corresponding voltages, which may then be inputted to another comparator 122 to determine if any computation error present in the matrix multiplication result 112 is within the threshold error value Δ. The same may be true for rows 5 and 6 of the decoder matrix circuitry 114, rows 7 and 8 of the circuitry 114, and so forth.

If a computation error is within the threshold error value Δ, the comparator 122 may output a low logic signal, which may then be inverted to a high logic signal and provided as input to an AND gate 124. If the computation error is outside of the threshold error value (i.e., either greater than Δ or less than −Δ), the comparator 122 may output a high logic signal, which may be inverted to a low logic signal and fed to the AND gate 124. In some aspects, the matrix multiplication result 112 may be validated if each comparator 122 determines that a difference between respective neighboring outputs of the decoder matrix circuitry 114 that it is configured to compare is less than the threshold error value Δ, in which case, each comparator 122 outputs a high logic signal to the AND gate 124, and the matrix multiplication result 112 is validated. On the other hand, if one or more comparators 122 output a low logic signal indicative of a computation error being an outside-threshold value (either greater than Δ or less than −Δ), then those comparator(s) 122 would output a low logic signal to the AND gate 124, and the AND gate 124 would in turn output a low logic signal that results in the matrix multiplication result 112 not being validated.

As previously noted, various types of analog computing errors may occur. In the case of a transient error, the error may be detected and corrected by the circuit implementation 100 disclosed herein and the analog ECC that it implements, or alternatively, the computation error may be corrected by simply reading the computation results again after the error is detected based on the output from the decoder matrix circuitry 114. In contrast, if a computation error is detected at a first read, and then detected again at a second read (or an nth read, where n≤2), a device controller (which may be a particular implementation of a processor 504 depicted in FIG. 5) may mark the computation error as permanent, and the crossbar array may be replaced or reprogrammed. In some aspects, the computation error may be corrected some threshold number of times, and may only be designated as permanent if it re-occurs a threshold number of times.

If the objective is to detect permanent errors (i.e., errors that occur every time after the initial onset of error), then in some example aspects, in order to reduce power consumption, the decoder matrix circuitry 114 may only be enabled for a last vector input in a batch of inputs. This may be achieved by selective application of a decoder signal 116 to enable the decoder matrix circuitry 114. In addition, in some example aspects, when the computation matrix A' is duplicated into multiple copies (i.e., encoded into multiple crossbar array portions)—such as in the case of convolutional kernels in convolutional neural networks (CNNs) for pixel-level parallelism—the decoder matrix circuitry 114 may be shared among the various copies, and may be enabled for one copy at a time.

Figure 2:
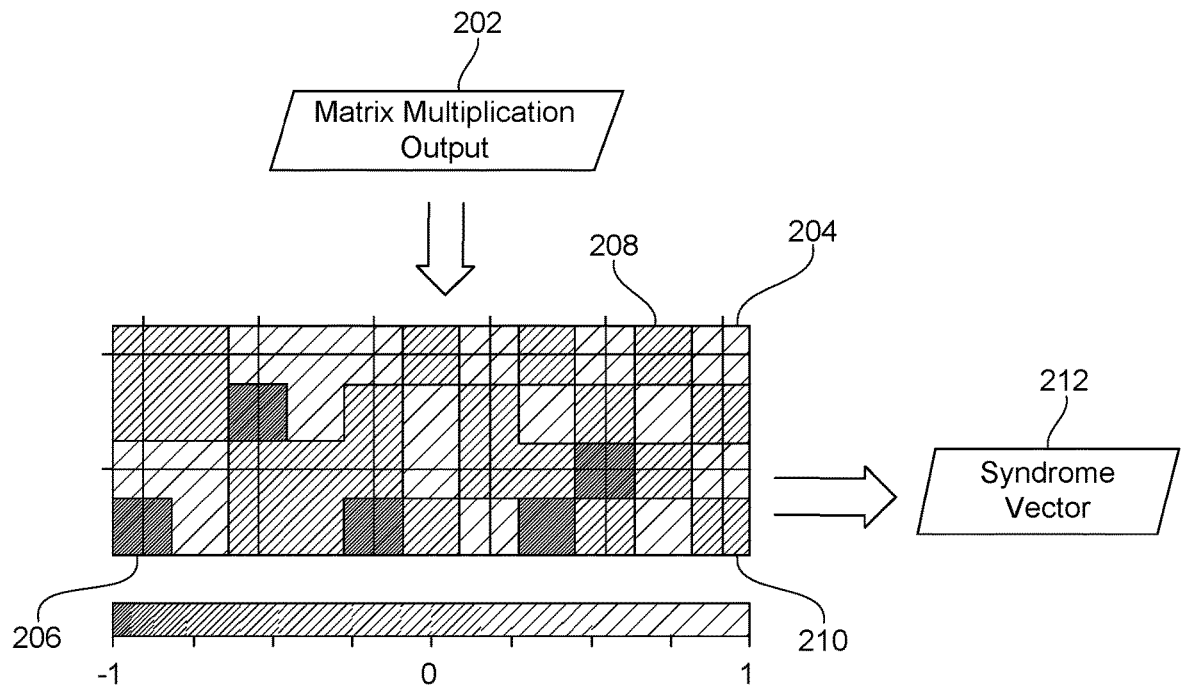
FIG. 2 schematically depicts obtaining a measured syndrome vector as output from a decoder matrix, where values of the measured syndrome vector indicate whether a computation error is present in a matrix multiplication output, according to aspects of the disclosed technology.

FIG. 2 schematically depicts obtaining a measured syndrome vector 212 as output from the decoder matrix A'', where values of the measured syndrome vector 212 indicate whether a computation error is present in a matrix multiplication output 202, according to aspects of the disclosed technology. In example aspects, the matrix multiplication output 202 may the currents read by the analog current measuring devices 110 depicted in FIG. 1, which represent the matrix multiplication operation between an input vector u and the matrix A that includes the computation matrix A' and the encoder matrix A''. FIG. 2 depicts a decoder matrix representation 204 that includes a collection of pixels, where each pixel represents a conductance difference between two neighboring memristors 118 of the circuitry 114 that encodes the decoder matrix. In the decoder matrix representation 204, a pixel 206 may represent a conductance difference $G_{HRS}-G_{LRS}$ which corresponds to the (HRS, LRS) representation of a −1 value in the decoder matrix; the pixel 208 may represent a conductance difference $G_{LRS}-G_{HRS}$ which corresponds to the (LRS, HRS) representation of a 1 value in the decoder matrix; and the pixel 210 may represent a conductance difference $G_{HRS}-G_{HRS}$ which corresponds to the (HRS, HRS) representation of a 0 value in the decoder matrix. Because the decoder matrix values are programmed into the circuitry 114 in the analog domain, it should be appreciated that the decoder matrix representation 204 may include a range of conductance differences between neighboring memristors that corresponds to a real number range between −1 and 1.

In example aspects of the disclosed technology in which there is no computation error that is outside the threshold error value Δ, all values of the output of the decoder matrix circuitry—the syndrome vector 212—will be below a threshold value. On the other hand, if one DPE output of the matrix multiplication output 202 is compromised (i.e., includes a computation error that exceeds the threshold error value Δ), then corresponding values of the decoder matrix are added to the syndrome vector 212. In example aspects, because of the pre-defined properties of the decoder/parity-checking matrix, each column of the decoder matrix is unique and contains exactly two non-zero entries. As such, in the scenario in which a single computation error is outside the threshold error value, there are exactly two above-threshold values in the syndrome vector 212. The absolute value of the computation error that adds up to the syndrome vector 212 may be given by $(G_{LRS}-G_{HRS})*V_{err}$, where $V_{err}$ is the error to be corrected. The location of the detected computation error may then be determined using an inverse matrix multiplication operation between a thresholded version of the syndrome vector 212 and the decoder matrix.

Figure 3:
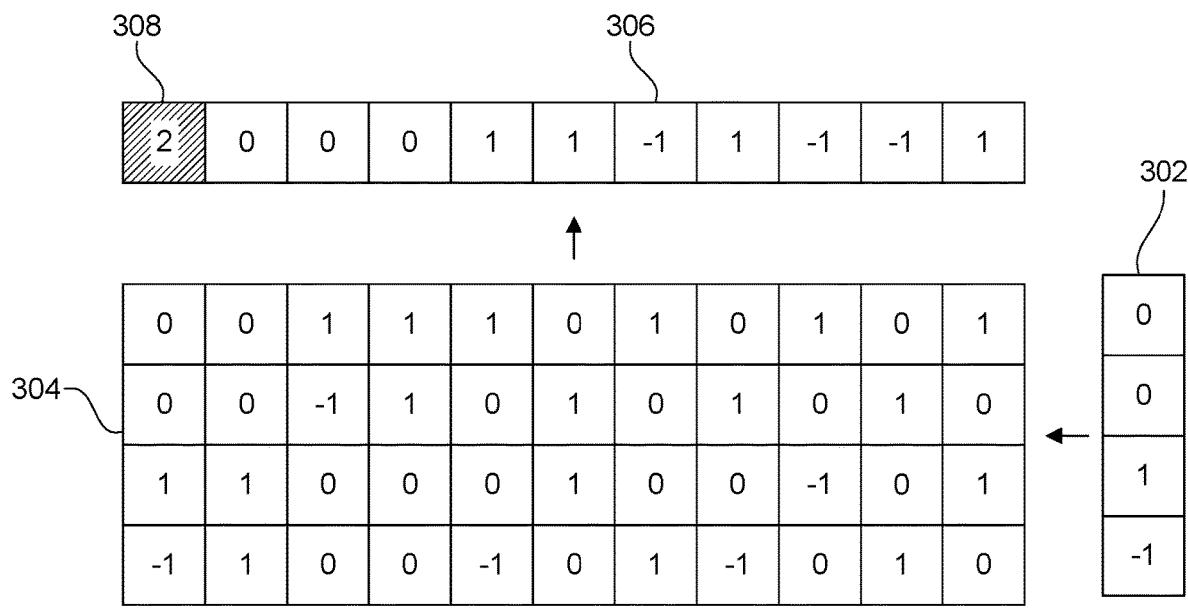
FIG. 3 schematically depicts an inverse matrix multiplication operation between a thresholded syndrome vector and a decoder matrix to obtain an inverse matrix multiplication output vector that indicates a location of a computation error in a matrix multiplication output, according to aspects of the disclosed technology.

FIG. 3 schematically depicts an inverse matrix multiplication operation between a thresholded syndrome vector 302 and the decoder matrix to obtain an inverse matrix multiplication output vector 306 that indicates a location of a computation error in a matrix multiplication output (e.g., the matrix multiplication output 202), according to aspects of the disclosed technology. The measured syndrome vector 212 may be thresholded to obtained the threshold syndrome vector 302 by converting the values of syndrome vector 212 to binary values. More specifically, each value in the syndrome vector 212 that is above a first threshold value may be converted to a 1 and each value in the syndrome vector 212 that is below a second threshold value to −1. In the case of a single error correction, there are two such values. In some aspects, the first and second threshold values may be additive inverses. Any value in the syndrome vector 212 that is between the first and second threshold values (which in the case of single error correction would be a zero value) is made a binary 0.

In some aspects, the thresholded syndrome vector 302 may be fed back to the third crossbar array portion (i.e., the decoder matrix circuitry 114) to perform an inverse matrix multiplication operation. In particular, values of the thresholded syndrome vector 302 may be mapped to corresponding voltages pairs and these voltage pairs may be applied to the row lines of the decoder matrix circuitry 114 to produce an output signal representing the inverse matrix multiplication output vector 306. More specifically, a binary 1 in the thresholded syndrome vector 302 (which corresponds to a value in the syndrome vector 212 that is above the first threshold value) may be mapped to ($V_r$, $-V_r$), while a binary $-1$ in the thresholded syndrome vector 302 (which corresponds to a value in the syndrome vector 212 that is below the second threshold value) may be mapped to ($-V_r$, $V_r$).

In example aspects, based on the properties of the decoder/parity-checking matrix, when the inverse matrix multiplication operation is performed, there is only one output (corresponding to a particular value of the inverse matrix multiplication output vector 306) that will have a current equal to $2V_r \cdot (G_{LRS} - G_{HRS})$, and which is output as the only matching element multiplication. In particular, ($V_r$, $-V_r$) multiplied with ($G_{LRS} - G_{HRS}$) and ($-V_r$, $V_r$) multiplied with ($G_{LRS} - G_{HRS}$) are the only results that result in a 1, and there is only one column in the decoder matrix with two matches to produce this result based on the properties of the decoder/parity-checking matrix.

As noted, there is only one output of the inverse matrix multiplication output that produces a current equal to $2V_r \cdot (G_{LRS} - G_{HRS})$. Thus, the location of a particular value in the inverse matrix multiplication output vector 306 that represents $2V_r \cdot (G_{LRS} - G_{HRS})$ corresponds to the location of the computation error. In particular, the location of that particular value in the output vector 306 corresponds to a particular column of the decoder matrix, and thus, a particular column of the decoder matrix circuitry 114. By virtue of the connection between the first and second crossbar array portions (i.e., circuitry 102 and circuitry 104) and the third crossbar array portion (i.e., circuitry 114), the particular column of the decoder matrix circuitry 114 corresponds to (e.g., is a same column as) a column in the circuitry 102 that contains the computation error.

In example aspects, the measured syndrome vector 212 may be used to determine the actual value of the error for correction. In particular, in example aspects, the value of the error for correction may be determined by the mean absolute value of the two outside-threshold values in the measured syndrome vector 212, which may be approximately ($G_{LRS} - G_{HRS}$)*$V_{err}$. Further, in example aspects, the same decoder matrix circuitry 114 may be used to perform the error correction.

Figure 4:
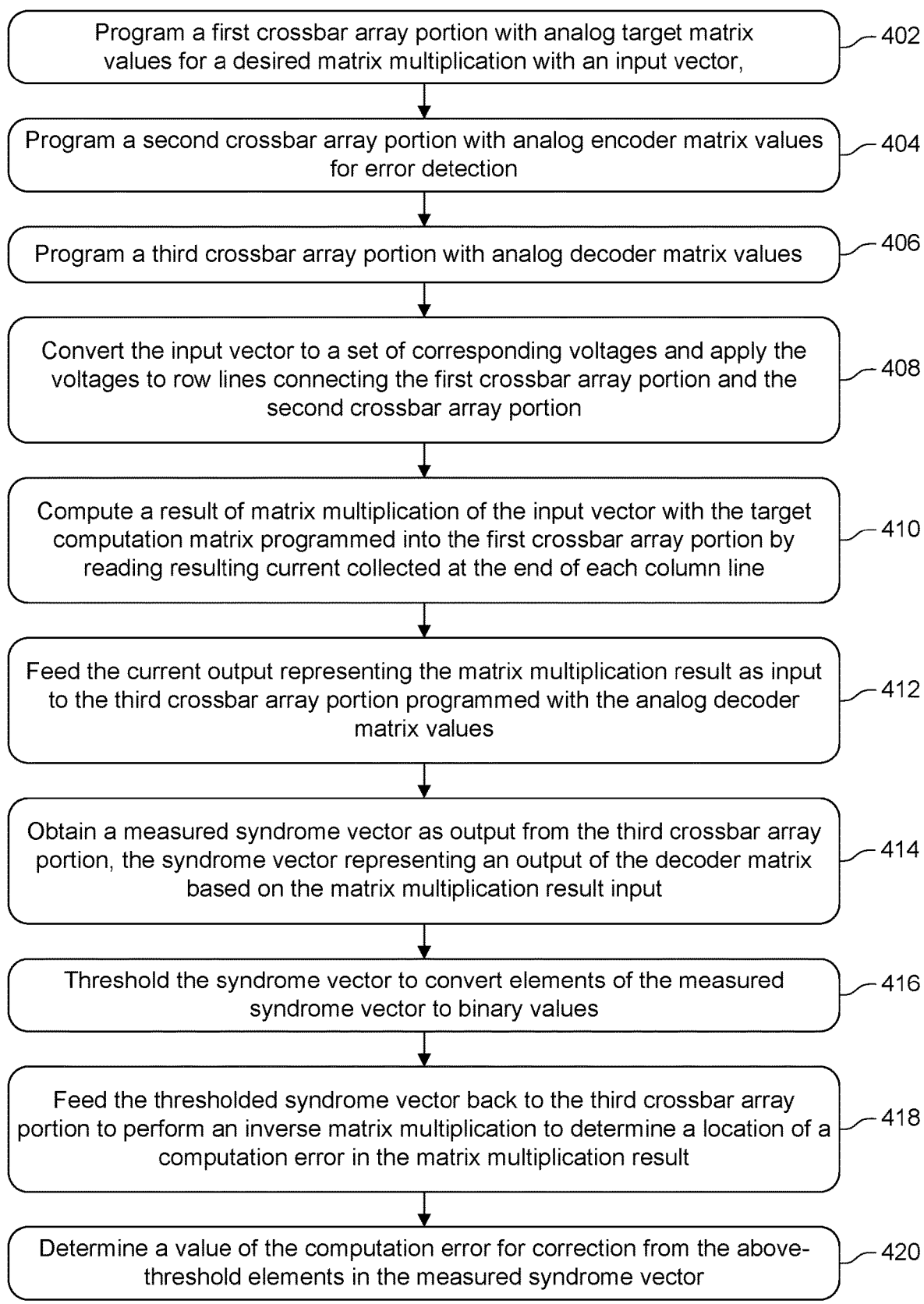
FIG. 4 is a flowchart of an illustrative method for programming a crossbar-based analog error detection and correction circuit and utilizing the programmed circuit to detect and correct computation error(s) in a matrix multiplication output, according to aspects of the disclosed technology.
Figure 5:
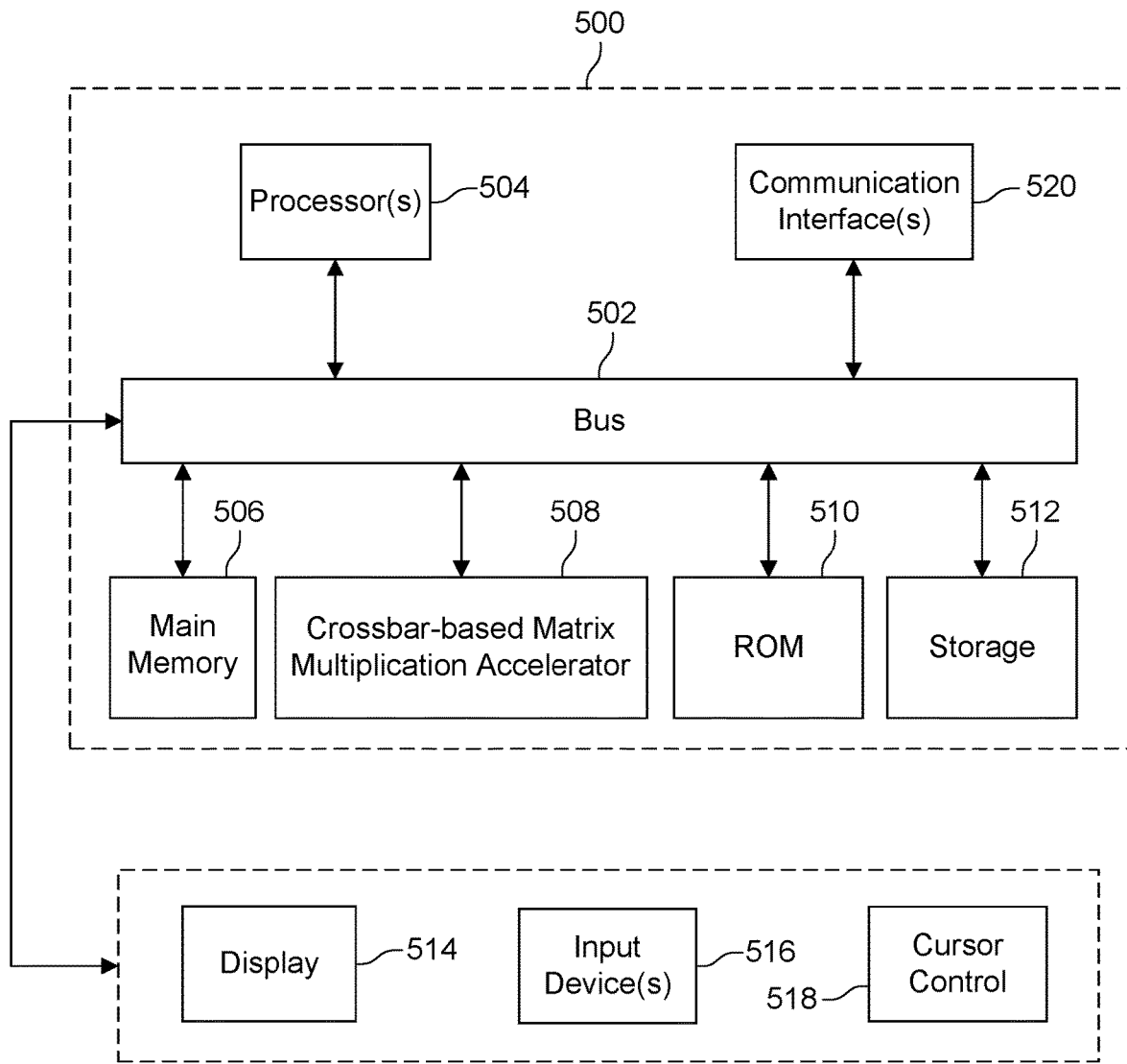
FIG. 5 is an example computing component that may be used to implement various features of the disclosed technology.

FIG. 4 is a flowchart of an illustrative method 400 for programming a crossbar-based analog error detection and correction circuit and utilizing the programmed circuit to detect and correct computation error(s) in a matrix multiplication output, according to aspects of the disclosed technology. In some aspects, the method 400 may be performed responsive to one or more processing units (e.g., FIG. 5, processor(s) 504, a controller, etc.) executing machine/computer-executable instructions stored in a storage device such as main memory 506, read-only memory (ROM) 512, and/or storage 514 (FIG. 5). In some aspects, the method 400 may be performed, at least in part, by hard-wired logic in a crossbar-based matrix multiplication hardware accelerator 508 (FIG. 5). One or more operations of the method 400 may be described hereinafter as being performed by a crossbar-based matrix multiplication hardware accelerator (e.g., hardware accelerator 508) that includes, for example, the circuit 100 depicted in FIG. 1.

At block 402 of the method 400, a first crossbar array portion may be programmed with analog values corresponding to the values of a target computation matrix A' for a desired matrix multiplication with an input vector u. For instance, each memristor 106 of the circuitry 102 (FIG. 1) may be programmed with a tuned conductance representative of a corresponding value in the computation matrix A'.

At block 404 of the method 400, a second crossbar array portion may be programmed with analog values representative of values of an encoder matrix A" that includes redundancy symbol for performing error correction of a computation result of a matrix multiplication of an input vector u with the computation matrix A'. For instance, each memristor 108 of the circuitry 104 (FIG. 1) may be programmed with a tuned conductance representative of a corresponding value in the encoder matrix A".

At block 406 of the method 400, a third crossbar array portion may be programmed with analog values representative of values in a decoder/parity-checking matrix H. As previously noted, the decoder/parity-checking matrix H may adhere to various properties, which may include without limitation in the case of single error correction, the uniqueness of each column of the matrix H and each column having exactly two non-zero values, the first of which is 1. Each memristor 118 of the circuitry 114 (FIG. 1) may be programmed with a tuned conductance representative of a corresponding value in the decoder/parity-checking matrix H. In some embodiments, the first, second, and third crossbar array portions may constitute part of the same crossbar array or multiple crossbar arrays that are connected to one another.

At block 408 of the method 400, an input vector u may be converted to a set of corresponding voltages and the voltages may be applied to shared row lines of the first and second crossbar array portions. More specifically, each element u, of an input vector u is fed into a respective DAC to produce a corresponding voltage level that is proportional to $u_i$.

At block 410 of the method 400, a result of a vector-matrix multiplication between the input vector u and the target computation matrix A' programmed into the first crossbar array portion may be computed. More specifically, a first output signal from the first crossbar array portion may represent a first output vector c'=uA', which is a result of the desired matrix multiplication computation between the input vector u and the computation matrix A'. Along similar lines, a second output signal from the second crossbar array portion may represent a second output vector c"=uA", which is a result of a matrix multiplication operation between the input vector u and the encoder matrix A". The second output vector c" may include redundancy symbols that allow for correcting computation errors in c'. The first and second output signals can be determined, that is, the first and second output vectors representing the matrix multiplication output of the first and second crossbar array portions can be computed, by reading the currents collected at the column lines.

At block 412 of the method 400, the current outputs that represent the matrix multiplication result of the input vector u with the computation and encoder matrices programmed into the first and second crossbar array portions, respectively, may be fed as input to the third crossbar array portion, in which the decoder matrix values are programmed. Then, at block 414 of the method 400, a measured syndrome vector may be obtained as output from the third crossbar array portion, where the measured syndrome vector represents an output of the decoder matrix based on the matrix multiplication result input that it received.

At block 416 of the method 400, the measured syndrome vector may be thresholded to obtain a thresholded syndrome vector. As previously noted, thresholding the measured syndrome vector may be include converting values of the syndrome vector to binary values. More specifically, thresholding may include converting a value in the measured syndrome vector that is above a first threshold value to a binary 1 and converting a value in the measured syndrome vector that is below a second threshold value to a binary −1.

At block 418 of the method 400, assuming that the syndrome vector indicates presence of a computation error that exceeds a threshold error value, the thresholded syndrome vector may be fed back to the third crossbar array portion to perform an inverse matrix multiplication operation to determine the location of the computation error in the matrix multiplication result. The location can be determined in the manner described earlier. Then at block 420 of the method 400, a value of the computation error for correction may be determined from the outside-threshold elements of the measured syndrome vector, as previously described.

FIG. 5 depicts a block diagram of an example computer system 500 in which various aspects of the disclosed technology described herein may be implemented. The computer system 500 includes a bus 502 or other communication mechanism for communicating information and one or more hardware processors 504 coupled with bus 502 for processing information. Hardware processor(s) 504 may be, for example, one or more general purpose microprocessors.

The computer system 500 also includes a main memory 506, such as a random access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 additionally includes a crossbar-based matrix multiplication hardware accelerator 508, which may include the example circuit 100 depicted in FIG. 1 that implements an analog ECC. In some aspects, the hardware accelerator 508 may be configured to execute instructions (i.e. programming or software code) stored in the main memory 506, ROM 512, and/or storage 514. In an example implementation, the exemplary hardware accelerator 508 may include multiple integrated circuits, which in turn, can include ASICs, FPGAs, or other Very Large Scale Integrated circuits (VLSIs). The integrated circuits of the exemplary hardware accelerator 508 may be specifically optimized to perform a discrete subset of computer processing operations, or execute a discrete subset of computer-executable instructions, in an accelerated manner. For example, hardware accelerator 508 may be configured or manufactured to implement analog crossbar-based vector-matrix multiplication as well as analog error detection and correction.

The circuit 100, which may implemented within the accelerator 508, may include non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the circuit 100 may be implemented using technologies that permit the circuit 100 to hold its contents even when power is lost or otherwise removed. Thus, data in the circuit 100 "persists" and the circuit 100 can act as what is known as a "non-volatile memory."

The computer system 500 further includes a read only memory (ROM) 512 or other static storage device coupled to bus 502 for storing static information and instructions for processor 504. A storage device 514, such as a magnetic disk, optical disk, or USB thumb drive (Flash drive), etc., is provided and coupled to bus 502 for storing information and instructions.

The computer system 500 may be coupled via bus 502 to a display 516, such as a liquid crystal display (LCD) (or touch screen), for displaying information to a computer user. An input device 518, which may include alphanumeric and other keys, is coupled to bus 502 for communicating information and providing command selections to processor 504. Another type of user input device is cursor control 520, such as a mouse, a trackball, or cursor direction keys for communicating direction information and command selections to processor 504 and for controlling cursor movement on display 516. In some aspects, the same direction information and command selections as cursor control 520 may be implemented via receiving touches on a touch screen without a cursor.

The computing system 500 may include a user interface module to implement a GUI that may be stored in a mass storage device as executable software codes that are executed by the computing device(s). This and other modules may include, by way of example, various components, such as software components, object-oriented software components, class components and task components including, without limitation, processes; functions, attributes; procedures; subroutines; segments of program code; drivers; firmware; microcode; circuitry; data; databases; data structures; tables; arrays; and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one aspect, the techniques herein are performed by computer system 500 in response to processor(s) 504 executing one or more sequences of one or more instructions contained in main memory 506. Such instructions may be read into main memory 506 from another storage medium, such as storage device 510. Execution of the sequences of instructions contained in main memory 506 causes processor(s) 504 to perform the process steps described herein. In alternative aspects, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 510. Volatile media includes dynamic memory, such as main memory 506. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 502. Transmission media can also take the form of acoustic or light waves, such as those generated during radio-wave and infra-red data communications.

The computer system 500 also includes a communication interface 522 coupled to bus 502. Communication interface 522 provides a two-way data communication coupling to one or more network links that are connected to one or more local networks. For example, communication interface 522 may be an integrated services digital network (ISDN) card, cable modem, satellite modem, or a modem to provide a data communication connection to a corresponding type of telephone line. As another example, communication interface 522 may be a local area network (LAN) card to provide a data communication connection to a compatible LAN (or WAN component to communicate with a WAN). Wireless links may also be implemented. In any such implementation, communication interface 522 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 522, which carry the digital data to and from computer system 500, are example forms of transmission media.

The computer system 500 can send messages and receive data, including program code, through the network(s), network link and communication interface 522. In the Internet example, a server might transmit a requested code for an application program through the Internet, the ISP, the local network and the communication interface 522. The received code may be executed by processor 504 as it is received, and/or stored in storage device 510, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example aspects. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain aspects include, while other aspects may not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An analog error correction circuit, comprising:
one or more non-volatile resistive analog memory crossbar arrays, comprising:
a first crossbar array portion programmed with values of a multiplication matrix;
a second crossbar array portion programmed with values of an encoder matrix;
a third crossbar array portion programmed with values of a decoder matrix,
wherein the first crossbar array portion and the second crossbar array portion are configured to output first and second outputs, respectively, that represent a result of a matrix multiplication operation with an input vector,
wherein the first and second outputs are provided as input to the third crossbar array portion,
wherein a third output of the third crossbar array portion represents a measured syndrome vector and indicates whether a computation error is present in the first output of the first crossbar array portion, wherein the measured syndrome vector is thresholded to obtain a thresholded syndrome vector; and
a fourth output of the third crossbar array portion represents a result of an inverse matrix multiplication operation between the thresholded syndrome vector and the decoder matrix.

2. The analog error correction circuit of claim 1, wherein the third output of the third crossbar array portion is used in combination with the values of the decoder matrix to determine a location of the computation error present in the first output of the first crossbar array portion.

3. The analog error correction circuit of claim 2, wherein the measured syndrome vector comprises two outside-threshold values indicative of existence of the computation error in the first output of the first crossbar array portion.

4. The analog error correction circuit of claim 3, wherein the thresholded syndrome vector is fed back to the third crossbar array portion to determine the location of the computation error.

5. The analog error correction circuit of claim 3, wherein a value of the computation error is a mean absolute value of the two outside-threshold values in the measured syndrome vector.

6. The analog error correction circuit of claim 1, wherein the fourth output is an output vector, and wherein a particular element of the output vector has a unique value indicative of a location of the computation error in the first output of the first crossbar array portion.

7. The analog error correction circuit of claim 6, wherein each column of the decoder matrix is unique, and wherein the particular element of the output vector is a result of the inverse matrix multiplication operation between a particular column of the decoder matrix and the thresholded syndrome vector.

8. The analog error correction circuit of claim 7, wherein the location of the computation error is in a particular column of the first crossbar array portion that generates a corresponding output that is provided as input to a particular column of the third crossbar array portion programmed with values of the particular column of the decoder matrix.

9. The analog error correction circuit of claim 1, wherein a conductance difference between respective neighboring non-volatile resistive device elements in the third crossbar array portion represents a corresponding value of the decoder matrix.

10. An analog error detection and correction method implemented in analog in-memory crossbars, the method comprising:
programming a first crossbar array portion of one or more non-volatile resistive analog memory crossbar arrays with values of a multiplication matrix;
programming a second crossbar array portion of the one or more non-volatile resistive analog memory crossbar arrays with values of an encoder matrix;
programming a third crossbar array portion of the one or more non-volatile resistive analog memory crossbar arrays with values of a decoder matrix,
converting an input vector to a set of corresponding voltages;
applying the set of corresponding voltages to the first crossbar bar array portion and the second crossbar array portion to obtain first and second outputs, respectively, that represent a result of a matrix multiplication operation with the input vector;
providing the first and second outputs as input to the third crossbar array portion to obtain a third output of the third crossbar array portion that represents a measured syndrome vector and indicates whether a computation error is present in the first output of the first crossbar array portion, wherein the measured syndrome vector is thresholded to obtain a thresholded syndrome vector; and
obtaining a fourth output of the third crossbar array portion representing a result of an inverse matrix multiplication operation between the thresholded syndrome vector and the decoder matrix.

11. The method of claim 10, further comprising using the third output of the third crossbar array portion in combination with the values of the decoder matrix to determine a location of the computation error present in the first output of the first crossbar array portion.

12. The method of claim 11, wherein the measured syndrome vector comprises two outside-threshold values indicative of existence of the computation error in the first output of the first crossbar array portion.

13. The method of claim 12, further comprising:
feeding the thresholded syndrome vector back to the third crossbar array portion to determine the location of the computation error.

14. The method of claim 10, wherein the fourth output is an output vector, and wherein a particular element of the output vector has a unique value indicative of a location of the computation error in the first output of the first crossbar array portion.

15. The method of claim 14, wherein each column of the decoder matrix is unique, and wherein the particular element of the output vector is a result of the inverse matrix multiplication operation between a particular column of the decoder matrix and the thresholded syndrome vector.

16. The method of claim 15, wherein the location of the computation error is in a particular column of the first crossbar array portion that generates a corresponding output that is provided as input to a particular column of the third crossbar array portion programmed with values of the particular column of the decoder matrix.

17. The method of claim 10, wherein a conductance difference between respective neighboring non-volatile resistive device elements in the third crossbar array portion represents a corresponding value of the decoder matrix.

18. A non-transitory computer-readable medium storing machine-executable instructions that responsive to execution by a processor cause a method to be performed, the method comprising:
programming a first crossbar array portion of one or more non-volatile resistive analog memory crossbar arrays with values of a multiplication matrix;
programming a second crossbar array portion of the one or more non-volatile resistive analog memory crossbar arrays with values of an encoder matrix;
programming a third crossbar array portion of the one or more non-volatile resistive analog memory crossbar arrays with values of a decoder matrix,
converting an input vector to a set of corresponding voltages;
applying the set of corresponding voltages to the first crossbar bar array portion and the second crossbar array portion to obtain first and second outputs, respectively, that represent a result of a matrix multiplication operation with the input vector;
providing the first and second outputs as input to the third crossbar array portion to obtain a third output of the third crossbar array portion that represents a measured syndrome vector and indicates whether a computation error is present in the first output of the first crossbar array portion, wherein the measured syndrome vector is thresholded to obtain a thresholded syndrome vector; and
obtaining a fourth output of the third crossbar array portion representing a result of an inverse matrix multiplication operation between the thresholded syndrome vector and the decoder matrix.

19. The non-transitory computer-readable medium of claim 18, wherein the instructions further cause using the third output of the third crossbar array portion in combination with the values of the decoder matrix to determine a location of the computation error present in the first output of the first crossbar array portion.

20. The non-transitory computer-readable medium of claim 18, wherein the measured syndrome vector comprises two outside-threshold values indicative of existence of the computation error in the first output of the first crossbar array portion.

* * * * *